US009577302B2

United States Patent
Challa et al.

(10) Patent No.: US 9,577,302 B2
(45) Date of Patent: Feb. 21, 2017

(54) RF FILTER CIRCUIT, RF FILTER WITH IMPROVED ATTENUATION AND DUPLEXER WITH IMPROVED ISOLATION

(71) Applicant: EPCOS AG, Munich (DE)

(72) Inventors: Ravi Kiran Challa, Rancho Santa Margarita, CA (US); Bhavya Adepu, San Diego, CA (US); Chandra Sekhar Reddy Kaipa, San Diego, CA (US); Ralph Durner, San Diego, CA (US); Wolfgang Till, San Diego, CA (US)

(73) Assignee: EPCOS AG, Munich (DE)

(*) Notice: Subject to any disclaimer, the term of this patent is extended or adjusted under 35 U.S.C. 154(b) by 0 days.

(21) Appl. No.: 14/726,297

(22) Filed: May 29, 2015

(65) Prior Publication Data

US 2015/0380791 A1 Dec. 31, 2015

Related U.S. Application Data (60) Provisional application No. 62/019,335, filed on Jun. 30, 2014.

(51) Int. Cl.
*H03H 9/72* (2006.01)
*H03H 9/64* (2006.01)
(Continued)

(52) U.S. Cl.
CPC ...... *H01P 1/20* (2013.01); *H03H 7/09* (2013.01); *H03H 9/568* (2013.01); *H03H 9/605* (2013.01);
(Continued)

(58) Field of Classification Search
CPC ............. H01P 1/20; H01P 1/213; H03H 7/09; H03H 9/02125; H03H 9/02874; H03H 9/0542; H03H 9/0547; H03H 9/0557; H03H 9/0561; H03H 9/0566; H03H 9/0571; H03H 9/0576; H03H 9/542; H03H 9/568; H03H 9/605; H03H 9/6406; H03H 9/6423; H03H 9/6433; H03H 9/6483; H03H 9/6493; H03H 9/706; H03H 9/725
(Continued)

(56) References Cited

U.S. PATENT DOCUMENTS 6,441,704 B1    8/2002   Ali-Hackl et al.
7,053,731 B2 *  5/2006   Iwamoto ............ H03H 9/0576
                                                           333/133

(Continued)

FOREIGN PATENT DOCUMENTS

EP      2530838 A1    12/2012
JP   2008-053922 A  *  3/2008
(Continued)

OTHER PUBLICATIONS

English language machine translation of JP 2008-053922 A, published Mar. 6, 2008, 7 pages.*

(Continued)

*Primary Examiner* — Barbara Summons
(74) *Attorney, Agent, or Firm* — Slater Matsil, LLP (57) ABSTRACT

A filter circuit providing improved attenuation, a filter having improved attenuation and a duplexer with improved isolation are provided. The filter circuit has a first and a second coupling conductor segment which couple an input port to a ground port or the filter's output port. The filter circuit can be realized in the filter. The duplexer can comprise the filter, especially as its transmission filter.

15 Claims, 6 Drawing Sheets

(51) Int. Cl.
*H01P 1/20* (2006.01)
*H03H 7/09* (2006.01)
*H03H 9/56* (2006.01)
*H03H 9/60* (2006.01)
*H03H 9/70* (2006.01)

(52) U.S. Cl.
CPC ........... *H03H 9/6483* (2013.01); *H03H 9/706* (2013.01); *H03H 9/725* (2013.01)

(58) Field of Classification Search
USPC .................... 333/189, 193, 195, 133, 132
See application file for complete search history.

(56) References Cited

U.S. PATENT DOCUMENTS

| | | | | |
|---|---|---|---|---|
| 7,619,491 | B2* | 11/2009 | Takata | H03H 9/0576 333/133 |
| 7,978,019 | B2* | 7/2011 | Wiesbauer | H01P 1/213 333/12 |
| 8,138,854 | B2* | 3/2012 | Hara | H03H 9/0028 333/126 |
| 8,378,760 | B2* | 2/2013 | Iwaki | H03H 9/0038 333/129 |
| 9,356,576 | B2* | 5/2016 | Okuda | H03H 9/0576 |
| 2012/0194298 | A1 | 8/2012 | Maurer | |
| 2012/0326808 | A1* | 12/2012 | Moreno Granado | H03H 9/02913 333/193 |
| 2015/0222246 | A1 | 8/2015 | Nosaka | |

FOREIGN PATENT DOCUMENTS

JP   2008-312146 A   * 12/2008
WO   2014064987 A1    5/2014

OTHER PUBLICATIONS

English language machine translation of JP 2008-312146 A, published Dec. 25, 2008, 7 pages.*

Chen, C.H. et al.: "Design of an LTCC Tri-Band Transceiver Module for GPRS Mobile Applications," IEEE Transactions on Microwave Theory and Techniques, Dec. 2014, pp. 2718-2724, vol. 52, No. 12.

Fleckenstein, A. et al.: "Design Study on a Compact, High Performance SAW Duplexer," IEEE Ultrasonics Symposium, Sep. 2005, pp. 1-4.

Novgorodov, V. et al.: "Modified Ladder-Type 2.4GHz SAW Filter With Transmission Zero," IEEE International Ultrasonics Symposium Proceedings, Oct. 11, 2010, pp. 1-4.

* cited by examiner

RF FILTER CIRCUIT, RF FILTER WITH IMPROVED ATTENUATION AND DUPLEXER WITH IMPROVED ISOLATION

This application claims the benefit of U.S. Provisional Application No. 62/019,335, filed on Jun. 30, 2014, which application is hereby incorporated herein by reference.

TECHNICAL FIELD

The present invention relates to RF filter circuits, e.g., for mobile communication devices, to RF filters having such circuits and to duplexers using such filter circuits and having a high isolation.

BACKGROUND

RF filter circuits may be used in wireless communication devices, e.g., mobile phones, to select wanted signals from a plurality of signals propagating in a plurality of frequency bands.

An important aspect of an RF filter circuit is the possible attenuation, i.e., the insertion loss that should be small in a pass band and high in a stop band. if the filter circuit is, in particular, used in pass band filters important aspects are bandwidth and the slope of the pass band flanks. If two pass band filters are combined, a duplexer can be obtained. An important parameter of duplexers is their isolation. The isolation mainly is the ratio of power fed into the transmission (TX) port divided by the power leaking to the reception (RX) port. Good attenuation (i.e., a high insertion loss) in a stop band—usually in the RX frequency band—is needed to obtain a good isolation.

In principle, filter circuits working with acoustic waves provide good attenuation. Filters with such filter circuits may be SAW filters (SAW=surface acoustic wave), BAW filters (BAW=bulk acoustic wave) or GBAW filters (GBAW=guided bulk acoustic wave). An electroacoustic filter is known from U.S. Pat. No. 6,441,704.

However, the ongoing trend towards miniaturization on the one hand, and more and more functionality on the other hand, jeopardizes the intrinsic good filter properties of such electroacoustic filters.

Thus, the need for filters with good filter properties even at small lateral dimensions exits. Further, duplexers comprising such filters are also needed.

SUMMARY

The filter circuit, the filter and the duplexer described herein provide the needed circuits and components.

An RF filter circuit of a first embodiment comprises an input port with an input terminal and an output port with an output terminal. The filter circuit further comprises a signal path between the input port and the output port. The signal path has a first series resonator. The filter circuit further comprises a ground terminal, a first coupling conductor segment and a second coupling conductor segment. The first coupling conductor segment is a part of the signal path and is directly connected to the input terminal. The second coupling conductor segment is directly connected to the output terminal or to the ground terminal. The RF filter circuit further has a rejection frequency band of high attenuation. Further, the first coupling conductor segment and the second coupling conductor segment are arranged next to each other and are electromagnetically coupled such that the coupling enhances the attenuation of the filter circuit in the rejection band.

Apart from the input terminal, the input port can have a second or further input terminal. It is, thus, possible that the input port works with unbalanced signals (one input terminal) or balanced signals (two input terminals). Also, the output port can have a second or further output terminal. Then, it is possible that the output port of the filter circuit works with unbalanced signals (one output terminal) or balanced output signals (two output terminals).

The signal path comprises conductor segments between the input port and the output port in which RF signals can propagate. The signal path can be provided for working with unbalanced signals or for working with balanced signals. The first series resonator is electrically connected in series within the signal path. RF signals propagating in the signal path have to pass the first series resonator.

The ground terminal provides a connection to a ground potential. The connection towards the ground potential can be a direct connection to ground potential or via an impedance element such as a capacitive element or an inductive element.

As the first coupling conductor element is a part of the signal path and as the first coupling conductor segment is directly connected to the input terminal, RF signals being fed into the input terminal propagate through the first coupling conductor segment. Due to the vicinity of the first and the second coupling conductor segments an electromagnetic coupling is possible and wanted. Compared to ideal filter circuits real filter circuits have a finite attenuation in a rejection band. This is related to the fact that due to finite conductivity properties of conductor segments a ground potential of a filter circuit in a real filter is not absolutely fixed in its value. RF signals may contaminate the ground potential. Thus, frequency components of an unwanted signal may be found at the ground potential and/or at the output of the filter. By electromagnetically coupling the first coupling conductor segment and the second coupling conductor segment the attenuation properties of the filter circuit can be improved. Accordingly, a duplexer of which such an RF circuit establishes a transmission filter or a reception filter can have an improved isolation.

However, creating such a first coupling conductor segment in the vicinity of a second coupling conductor segment adds further conductor segments to a filter, thus jeopardizing the ongoing trend towards miniaturization and increasing the probability of further crosstalk between conductor elements. Thus, the respective coupling conductor segments and their topology in a filter need to be chosen very carefully and the design of the respective other filter components must be adapted to the presence of the coupling conductor segments if the full potential of the respective electromagnetic coupling is to be utilized.

It is possible that the second coupling conductor segment is directly connected to the output terminal.

However, it is also possible that the second coupling conductor segment is directly connected to the ground terminal.

Thus, it is possible that an electromagnetic coupling between input signals and signals propagating in the output terminal is obtained and it is also possible that such a coupling between input signals and a non-ideal ground potential is obtained.

It is possible that the RF filter circuit has a ladder-type structure and comprises a second series resonator. The second series resonator is electrically connected in the signal path and in series to the first series resonator. The RF filter circuit may then further comprise a first parallel branch and a second parallel branch. The first parallel branch electrically connects the signal path to ground and comprises a first parallel resonator. The second parallel branch electrically connects the signal path to ground and comprises a second parallel resonator. The first parallel resonator and the second parallel resonator are, thus, electrically connected in parallel and establish shunt connections between the signal path and ground.

Each series and each parallel resonator can have a resonance frequency and an anti-resonance frequency. If the respective frequencies are chosen accordingly then the RF filter circuit can establish a band pass filter or a band stop filter. In any case, the RF filter circuit has a rejection frequency band with improved attenuation.

It is possible that the attenuation is enhanced by cancellation of unwanted RF signals. Cancellation is obtained in the first and in the second coupling conductor segments due to the electromagnetic coupling.

It is possible that the first series resonator is dedicated to work with acoustic waves. Thus, the first series resonator is an electroacoustic resonator and may be an SAW resonator, a BAW resonator or a GBAW resonator. If the RF filter circuit comprises further resonators such as a second series resonator and a first and/or a second parallel resonator, then these additional resonators may also be electroacoustic resonators. The additional resonators may be of the same type as the first series resonator.

It is possible that the first series resonator comprises resonator components that are arranged on a chip. If the first series resonator is an SAW resonator, the resonator components may be bus bars and electrode fingers, a thermal compensation layer (TCF layer=thermal coefficients of frequency) or a frequency adjusting layer. By choosing the thickness of the frequency adjusting layer the frequency of the resonator can be tuned.

If the RF filter circuit comprises further resonators then the further resonators' components may also be arranged on the same chip or they may be arranged on another chip.

If the first series resonator is a BAW resonator, then the resonator components may comprise a lower electrode area, an upper electrode area and a piezoelectric material between the two electrode areas.

If the first series resonator is a GBAW resonator, then the resonator components may comprise bus bars, electrode fingers and a dielectric material burying the bus bars and the electrode fingers.

In the case of an SAW resonator or a GBAW resonator, the chip may comprise a piezoelectric material such as lithium tantalite ($LiTaO_3$), lithium niobate ($LiNbO_3$) or quartz. If the first series resonator is a BAW resonator, then the chip may be a semiconductor chip.

It is possible that the chip is arranged on a carrier substrate.

The carrier substrate may comprise a single layer of a dielectric material, e.g., a PCB (printed circuit board) material. The carrier substrate may comprise conductor segments on its top side or on its bottom side for electrically connecting the filter circuit to an external circuit environment.

However, it is possible that the carrier substrate is a multilayer substrate with a plurality of two or more dielectric layers and metallization layers in between. Within the metallization layers conductor segments such as signal lines, impedance elements such as capacitance elements or inductive elements, etc. may be structured and electrically connected to the first series resonator. Thus, circuit components of the RF filter circuit may be embedded within the multilayer substrate.

It is possible that the first coupling conductor segment and the second coupling conductor segment are arranged on the chip or on the carrier substrate.

Depending on the desired degree of coupling and on the distance between the coupling area and other circuit components arranging the coupling conductor segments on the chip or on the carrier substrate provides two alternative solutions.

Conventional and known techniques are possible for combining the chip and the carrier substrate. It is thus possible that the chip and the carrier substrate are combined to a filter component using DSSP techniques where DSSP (die sized SAW packaging) is a brand name for small sized highly integrated electrical filter component.

It is possible that the first coupling conductor segment and the second coupling conductor segment are aligned in parallel. The two conductor segments can be arranged next to each other in the same layer within a layer system on a chip or within a layer system in a multilayer substrate. However, it is possible that the two conductor segments are arranged one above the other in different layers of a multilayer structure. By choosing the length and the distance between the two parallel conductor segments and by choosing the material and the dielectric properties of the material in between the degree of coupling between the two conductor segments can be adjusted according to requirements that the filter needs to fulfil.

It is possible that the first coupling conductor segment and the second coupling conductor segment are dedicated to conduct RF signals in the same or in the opposite direction.

By choosing the direction of propagation relative to one another a designer has an additional degree of freedom for adjusting the degree of coupling.

It is possible that the first coupling conductor segment and the second coupling conductor segment establish a segment of a coupled differential signal line.

For example by placing the two different conductor segments in opposite directions, opposite flowing currents may produce oppositely polarized magnetic and/or electric fields which may reduce or even cancel each other. Thus, a differential line operation may be obtained. By utilizing such a differential line for TX signals and electromagnetic signals propagating in a TX ground path or in the filter's output port, a cancellation effect can be created which improves the filter circuit's attenuation and an according filter's electrical properties. An according duplexer obtains an improved isolation.

It is possible that the first coupling conductor segment and the second coupling conductor segment are dedicated to carry currents having opposite directions and being out of phase. By choosing the phase of the RF signals propagating at the location of the conductor segments, the designer has a further degree of freedom in adjusting the degree of coupling.

It is possible that the electromagnetic coupling comprises a magnetic coupling as its main constituent.

An electromagnetic coupling usually has an electrical component and a magnetic component. By choosing the geometric details of the conductor segments and the distance between the conductor segments and the electromagnetic properties of the material in between, emphasis of the coupling can be laid on the magnetic aspect or on the electric aspect. Thus, a further degree of freedom in adjusting the degree of coupling can be obtained.

It is possible to utilize such an RF filter circuit in an according RF filter. Thus, an RF filter may comprise such an RF filter circuit.

It is further possible that a duplexer comprises such an RF filter with an improved attenuation. Then, it is possible that the rejection band of the RF filter is a reception band (RX). The enhanced attenuation of RF signals in the reception band enhances the duplexer's isolation.

It is possible that the duplexer has a transmission filter, a reception filter and an impedance matching circuit. The first series resonator of the filter circuit is an element of the transmission filter. The impedance matching circuit is connected between the transmission filter and the reception filter. It is also possible that such a duplexer has a DMS structure (DMS=double mode SAW) in the reception filter.

Especially if such a filter is utilized in a duplexer, TX input signals and ground currents may add up (interfere) at the antenna but cancel each other at the output port of the reception filter. Thus, the duplexer's isolation is improved.

Depending on the geometric details of the conductor segments oppositely polarized magnetic fields can be obtained that cancel each other for an improved attenuation and, thus, an improved isolation.

Series resonators and parallel resonators may comprise interdigitated electrodes with bus bars and electrode fingers that are arranged in an acoustic track between acoustic reflectors. However, each resonator may be realized as a multiport resonator (MPR) with more than one electroacoustic transducer in the according acoustic track.

The filter circuit, the filter, the duplexer and the basic working principles and preferred embodiments are further described in more detail in the accompanying schematic figures, not limiting the scope of the invention.

DETAILED DESCRIPTION OF ILLUSTRATIVE EMBODIMENTS

Figure 1:
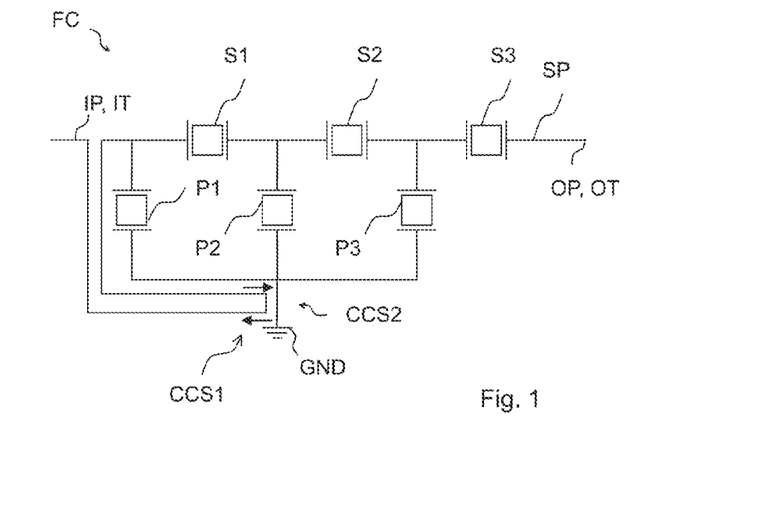
FIG. 1 shows a filter circuit FC with a ladder-structure where an input port is electromagnetically coupled to a ground port.

FIG. 1 illustrates an equivalent circuit diagram of a filter circuit FC of a basic example in which an electromagnetic coupling between an input port and a ground potential is obtained. The filter circuit FC comprises a signal path SP in which a first S1, a second S2 and a third S3 series resonator are electromagnetically coupled in series. A first parallel resonator P1 is electrically connected in a first parallel branch shunting the signal path to ground GND. A second parallel resonator P2 is electrically connected in a second parallel branch shunting the signal path SP to ground GND. A third parallel resonator P3 is electrically connected in a third parallel branch shunting the signal path SP to ground GND.

It is possible that the third parallel resonator P3 comprises a parallel cascade of two parallel resonators of which one is a conventional resonator and of which the second is an MPR resonator.

The input port IP comprises at least an input terminal IT. From the input terminal IT conductor segments lead to an area of electromagnetic coupling. The electromagnetic coupling takes place between the first coupling conductor segment CSS1 of the input port and a second coupling conductor segment CCS2 which is—in this example—a conductor segment to ground GND.

In the equivalent circuit diagram shown in FIG. 1, the output port OP comprises a single output terminal OT. However, a filter circuit FC working with balanced RF signals at the input port IP or balanced output signals at the output port OP is also possible.

Figure 2:
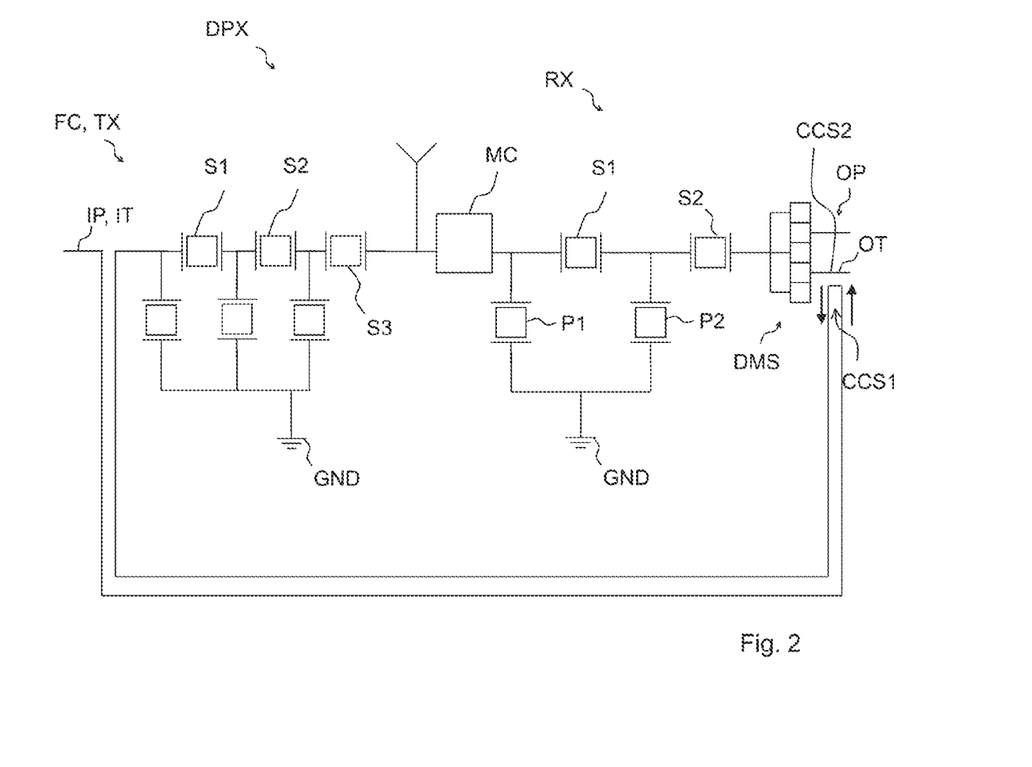
FIG. 2 shows a duplexer where the input port of the transmission filter is electromagnetically coupled to an output terminal of a balanced output port of the reception filter.

FIG. 2 shows a possible implementation of coupling conductor segments for improved attenuation in a duplexer DPX. The duplexer DPX comprises a transmission filter TX and a reception filter RX. The transmission filter TX may be the RF filter with the above-described filter circuit FC. The transmission filter TX comprises three series resonators S1, S2, S3 and three parallel resonators. The reception filter RX comprises a first S1 and a second S2 series resonator and a first parallel resonator P1 in a first parallel branch and a second parallel resonator P2 in a second branch. The reception filter RX further comprises a DMS filter structure DMS. The DMS filter structure DMS has a balanced signal output and provides an output port OP that is compatible with balanced signals. Thus, the output port OP comprises two output terminals. One output terminal OT of the output port OP is electromagnetically coupled to the input terminal IT of the input port IP. Therefore, the first coupling conductor segment CCS1 electromagnetically connected to the input port IP is arranged in the vicinity of the conductor segment of the output terminal OT establishing the second coupling conductor segment.

Between the transmission filter TX and the reception filter RX an impedance matching circuit MC is arranged. Further, between the transmission filter TX and the impedance matching circuit MC an antenna port is arranged which may be connected to an antenna.

As such a duplexer comprises a plurality of resonators, conductor segments and circuit elements in an impedance matching circuit, further providing conductor segments for an electromagnetic coupling via the first and second coupling conductor segments is not a triviality but demands a careful design and an adaption of the electromagnetic and acoustical properties of the respective other duplexer components.

Figure 3:
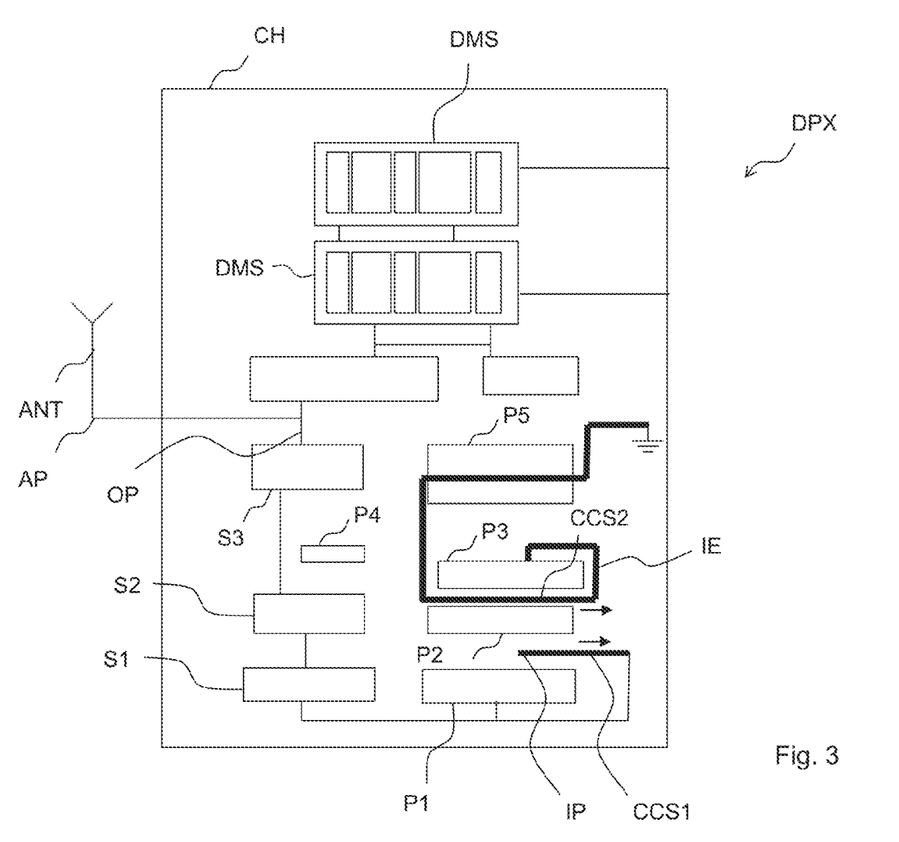
FIG. 3 shows a possible layout of a filter topology and a possible arrangement of the first coupling conductor segment relative to the second coupling conductor segment.

FIG. 3 shows a possible layout of a duplexer DPX. Series resonators S1, S2, S3 define the main direction of propagation of transmission signals from the input port IP to an antenna ANT connected to an antenna port AP. The reception filter comprises a series resonator and two DMS structures arranged in two parallel aligned acoustic tracks. Apart from the first, second and third series resonator, the transmission filter further comprises up to five parallel resonators P1 to P5 of which, for example P4 and P5 may establish different acoustic tracks of an MPR resonator.

The duplexer DPX comprises conductor segments—shown in FIG. 3 by bold lines—which establish conductor segments needed for the electromagnetic coupling. Especially the conductor segments between a parallel resonator, i.e., a third parallel resonator P3, and ground may establish a conductor pattern utilized for the electromagnetic coupling. Thus, the ground connection between the resonator and ground may be arranged in a coil-like pattern which realizes an inductive element IE. The electromagnetic coupling is visualized by two parallel aligned arrows. The inductive element realized by the conductor segments may have a conductivity in the range of 0.1 to 0.5 nH, e.g., 0.3 nH. Depending on the phase of a signal propagating in the second coupling conductor segment CCS2 and in the first coupling conductor segment CCS1 parallel or anti-parallel currents at the place of the electromagnetic coupling can be adjusted. The phase of the signal of one or two of the conductor segments can be adjusted by adjusting the length of the respective conductor segments comprising the coupling conductor segments.

Figure 4:
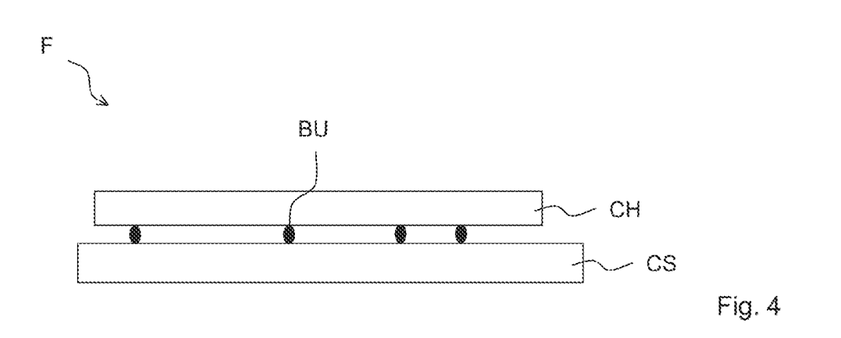
FIG. 4 shows a possible arrangement of a chip located above the carrier substrate. The chip and the carrier substrate establish an RF filter F.
Figure 5:
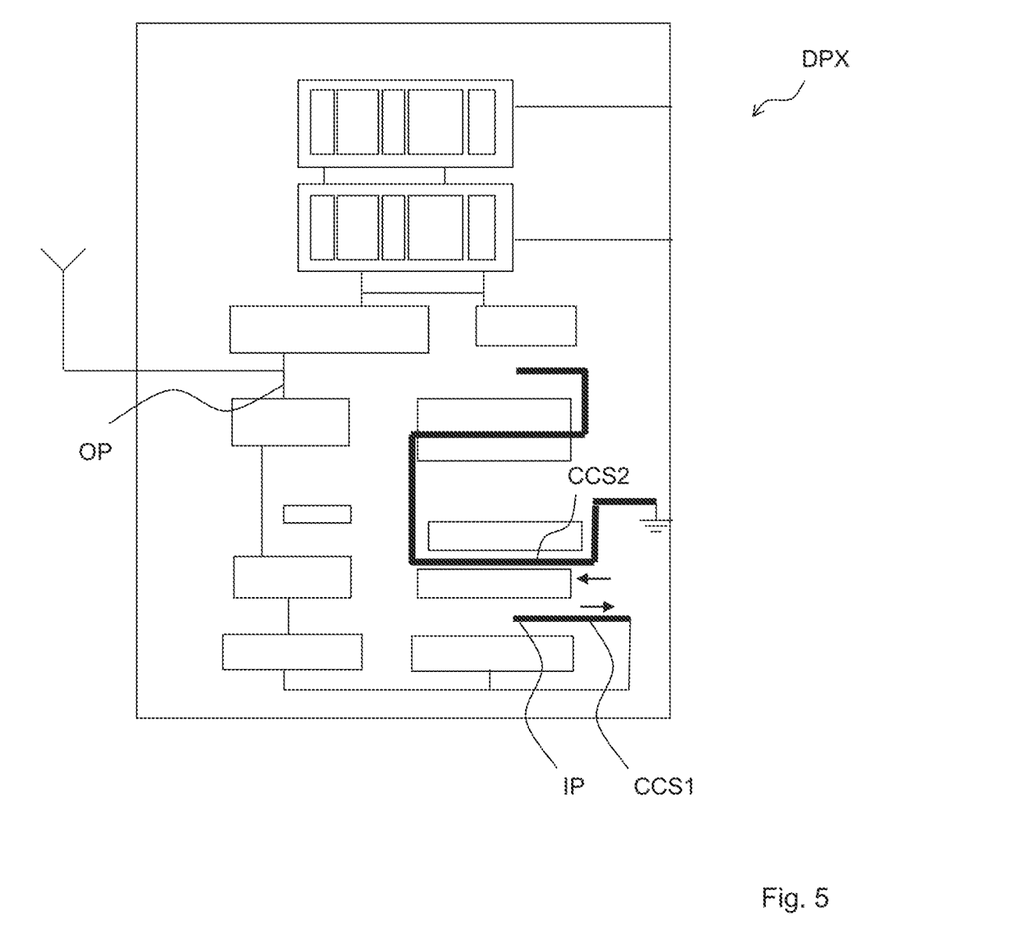
FIG. 5 shows another possible layout and another possible arrangement of the first coupling conductor segment.

The topologies of the layouts shown in FIGS. 3 and 5 may comprise conductor elements which are arranged in different layers on a chip. Especially if conductor segments have an overlap area, a dielectric material can be arranged between the conductor elements FIG. 4 schematically illustrates an RF filter F where filter components are arranged within or on a surface of a chip CH. The chip is arranged on a carrier substrate CS. The chip CH and the carrier substrate CS may be electrically and mechanically connected via bump connections BU. However, other electrical connections such as bond wires are also possible.

The place of the first and second coupling conductor segments may be located on the chip CH or on the carrier substrate CS.

FIG. 5 shows a possible layout of a duplexer DPX in which the conductor segments comprising the second coupling conductor segment CCS2 are chosen such that—at the place of the electromagnetic coupling—anti-parallel currents inducing anti-parallel magnetic fields are obtained as visualized by anti-parallel arrows.

Figure 6:
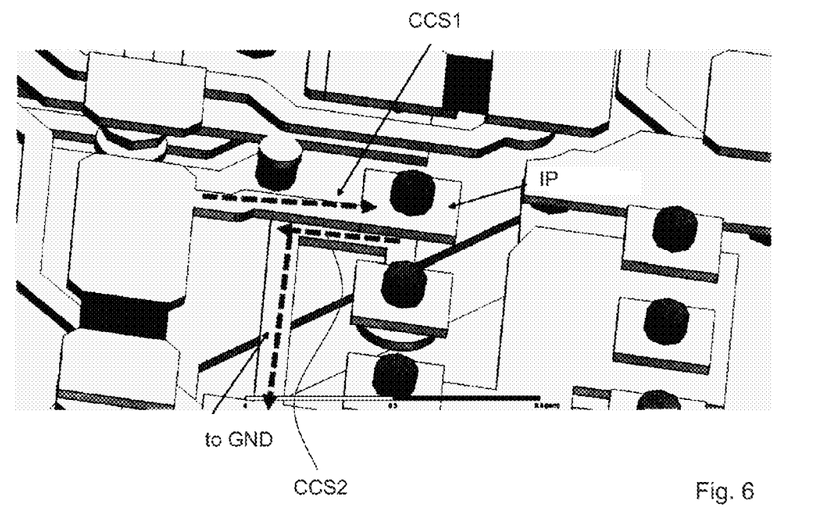
FIG. 6 shows a perspective view of a physical realization of first and second coupling conductor segments within the multi-layered construction of a filter component.

FIG. 6 shows a possible realization of conductor elements establishing the first CCS1 and the second CCS2 coupling conductor segments within a layered structure of a filter. The first coupling conductor segment CCS1 is directly connected to an area establishing the input port IP. In the vicinity of the first coupling conductor segment CCS1 the second coupling conductor segment CCS2 is arranged which is connected via further conductor segments to ground.

Figure 7:
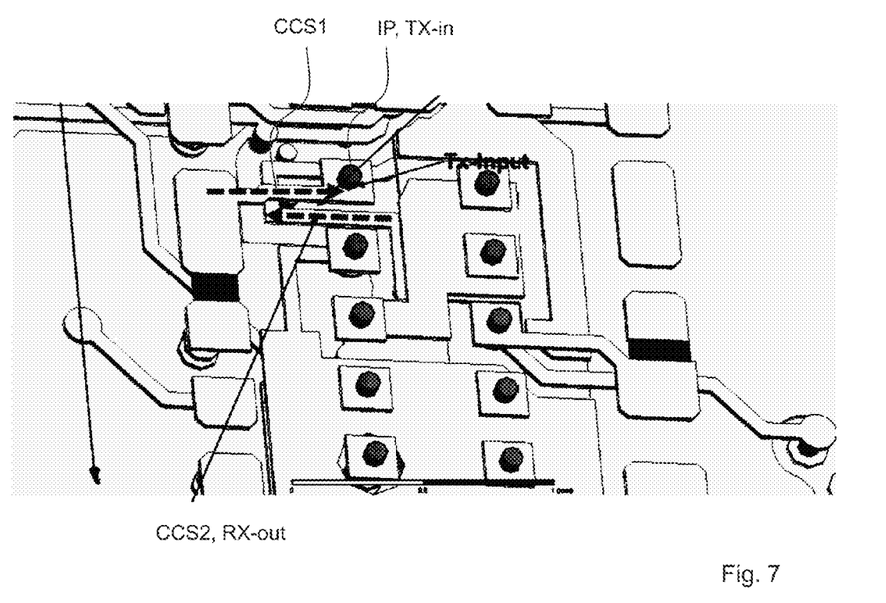
FIG. 7 shows a perspective view onto another possible embodiment of a physical realization of a filter component.

FIG. 7 shows a perspective view of another possible embodiment where the first coupling conductor segment CCS1 is coupled to the output port of the reception filter. In this embodiment conductor segments leading the second coupling conductor segment CCS2 of the output port are lead to the vicinity of the input port IP of the TX filter.

Figure 8:
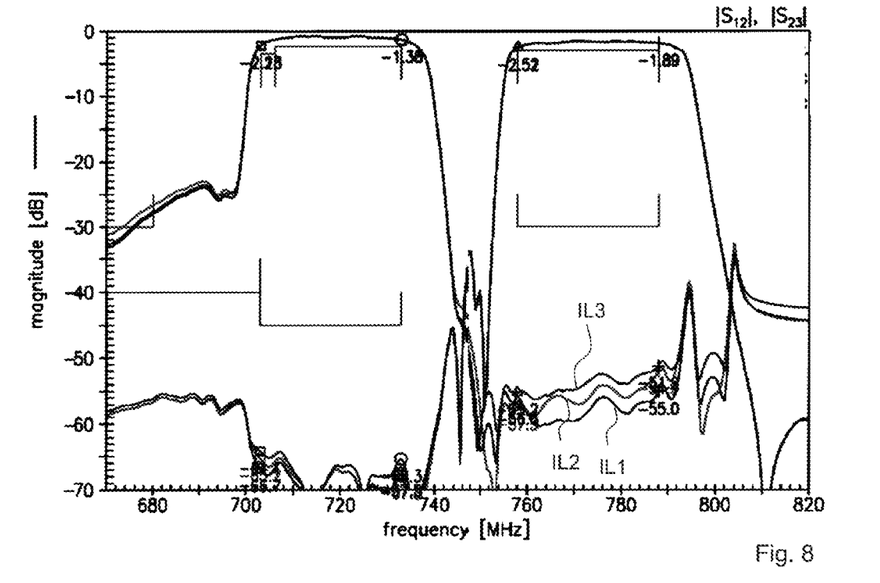
FIG. 8 shows simulated frequency-dependent matrix elements $S_{12}S_{23}$ indicated the impact of different embodiment of electromagnetic coupling.

FIG. 8 shows simulation results for the frequency-dependent matrix elements $S_{12}$ (insertion loss between the input port of the transmission filter and the antenna port) and the matrix element $S_{23}$ (insertion loss between the antenna port and the output of the reception filter) of a duplexer. The filters of the duplexer provide two pass bands. The pass band comprising frequencies between 700 and 740 MHz establishes the transmission band, i.e., the pass band of the transmission filter. The pass band comprising frequencies between 760 and 790 MHz establishes the reception band, i.e., the pass band of the reception filter.

Curve IL1 is the matrix element $S_{12}$ of a duplexer where the input port is electromagnetically coupled to a conductor pattern connecting parallel resonators to ground and having an inductivity of 0.3 nH. Curve IL2 is the simulated matrix element $S_{12}$ of an embodiment where the currents in the two coupling conductor segments flow in the same direction. Curve IL3 is the matrix element $S_{12}$ of an embodiment where the current in the two coupling conductor segments flows in opposite directions.

Figure 9:
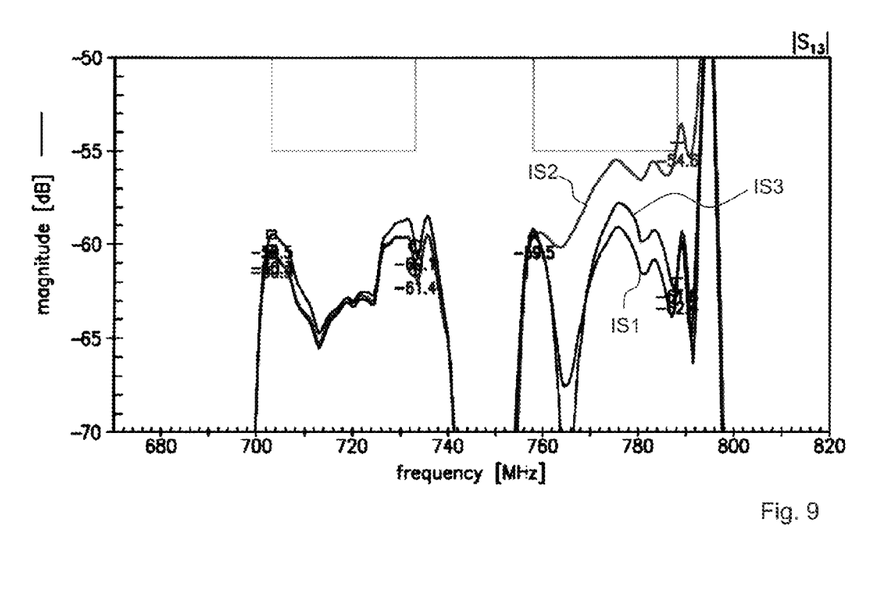
FIG. 9 shows simulated frequency-dependent matrix elements $S_{13}$ indicating the impact of different embodiments of electromagnetic coupling.

FIG. 9 shows the calculated matrix elements $S_{13}$ (isolation) of the duplexer according to the insertion losses of FIG. 8. Curve IS1 is the matrix element $S_{13}$ of the duplexer where the conductor segments of the second coupling conductor segment establish a inductive element of 0.3 nH, curve IS2 is the matrix element $S_{13}$ of an embodiment where in the coupling conductor segments the currents have the same direction and curve IS3 is the matrix element $S_{13}$ of an embodiment where the currents in the coupling conductor segments have the opposite direction.

Figure 10:
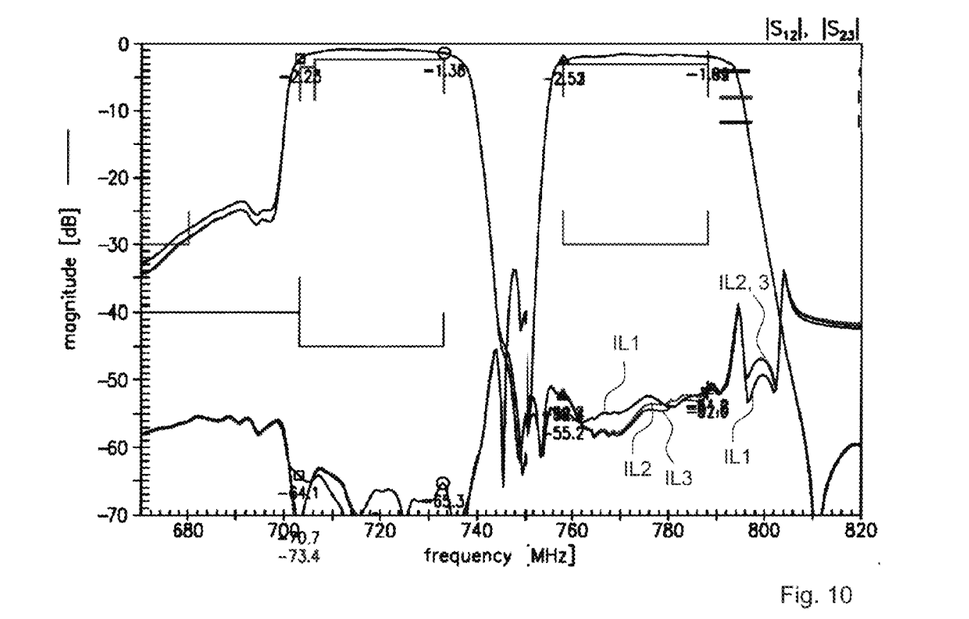
FIG. 10 shows simulated matrix elements $S_{12}S_{S23}$ of a duplexer indicating the impact of different embodiments of the electromagnetic coupling.

FIG. 10 shows simulated insertion losses for the transmission filter and the reception filter of a duplexer. Curve IL1 is the matrix element $S_{12}$ of an embodiment where the two coupling conductor segments establish segments of a differential signal line where the coupling conductor segments are arranged in the package of a DSSP (die sized SAW packaging) component. Curve IL2 is the matrix element $S_{12}$ of an embodiment where the coupling conductor segments establish conductor segments of differential signal line and the coupling conductor segments are arranged in a laminate structure of the multilayer carrier substrate. Curve IL3 is the matrix element $S_{12}$ of an embodiment where the two coupling conductor segments establish conductor segments of a differential signal line where the coupling conductor segments are arranged between the transmission filter and the reception filter on an according filter chip.

Figure 11:
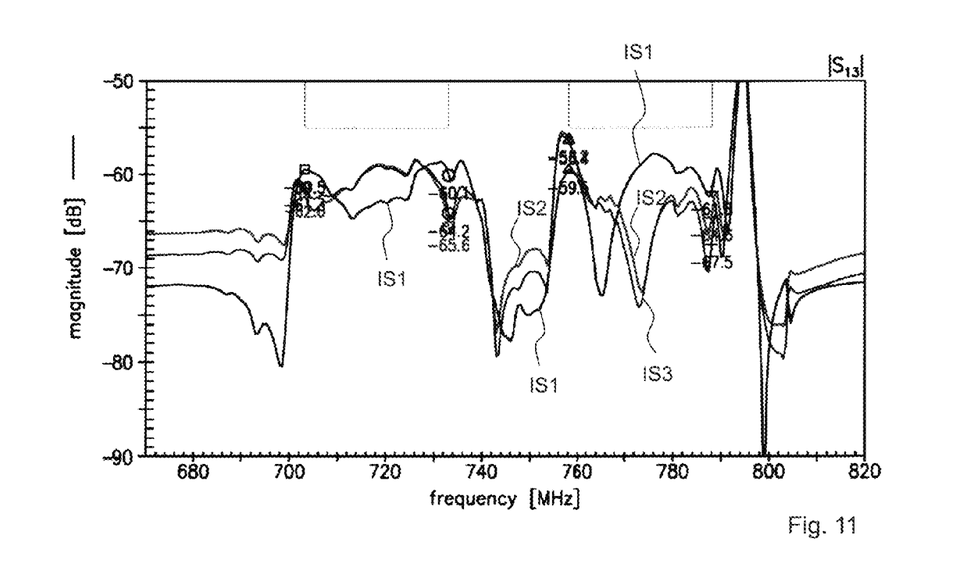
FIG. 11 shows simulated frequency-dependent matrix elements $S_{13}$ indicating the impact of different embodiments of electromagnetic coupling.

FIG. 11 shows the according matrix elements $S_{13}$ of the duplexer corresponding to the curves shown in FIG. 10. Curve IS1 is the matrix element $S_{13}$ where the coupling conductor segments are arranged in package of a DSSP-component, curve IS2 is the matrix element $S_{13}$ of an embodiment where the segments establish a differential signal line in a laminate structure of the carrier substrate and curve IS3 is the matrix element $S_{13}$ where the area of electromagnetic coupling is arranged between the TX filter and the RX filter on the filter chip.

From FIGS. 8 to 11 it is clear that the designer has a plurality of possibilities to adapt a duplexer's electrical properties to external requirements.

Neither the filter circuit nor the filter nor the duplexer are restricted to details and embodiments described above or shown in the figures. Filter circuits, filters and duplexers comprising further coupling conductor segments or further circuit components are also comprised.

What is claimed is:

1. An RF filter circuit, comprising:
   an input port with an input terminal;
   an output port with an output terminal;
   a signal path between the input port and the output port, the signal path having a first series resonator;
   a ground terminal;
   a first coupling conductor segment that is a part of the signal path, the first coupling conductor segment being directly connected to the input terminal; and
   a second coupling conductor segment directly connected to the output terminal or to the ground terminal, wherein the first coupling conductor segment and the second coupling conductor segment are arranged next to each other and are electromagnetically coupled such that the coupling enhances attenuation of the RF filter circuit in a rejection frequency band,
   wherein the first coupling conductor segment and the second coupling conductor segment are aligned in parallel,
   wherein the first coupling conductor segment and the second coupling conductor segment are dedicated to conduct RF signals in opposite directions,
   wherein the first coupling conductor segment and the second coupling conductor segment establish a segment of a coupled differential signal line, and
   wherein the first coupling conductor segment and the second coupling conductor segment are dedicated to carry currents that have opposite directions and are out of phase.

2. The RF filter circuit of claim 1, wherein the second coupling conductor segment is directly connected to the output terminal.

3. The RF filter circuit of claim 1, wherein the second coupling conductor segment is directly connected to the ground terminal.

4. The RF filter circuit of claim 1, wherein the RF filter circuit comprises a ladder type structure and comprises:
   a second series resonator electrically connected in the signal path in series to the first series resonator;
   a first parallel branch electrically connecting the signal path to ground and comprising a first parallel resonator; and
   a second parallel branch electrically connecting the signal path to ground and comprising a second parallel resonator.

5. The RF filter circuit of claim 1, wherein the attenuation is enhanced by cancellation of unwanted RF signals in the first and second coupling conductor segments.

6. The RF filter circuit of claim 1, wherein the first series resonator is dedicated to work with acoustic waves.

7. The RF filter circuit of claim 1, wherein the first series resonator comprises resonator components arranged on a chip.

8. The RF filter circuit of claim 7, wherein the chip is arranged on a carrier substrate.

9. The RF filter circuit of claim 8, wherein the first coupling conductor segment and the second coupling conductor segment are arranged on the chip.

10. The RF filter circuit of claim 8, wherein the first coupling conductor segment and the second coupling conductor segment are arranged on the carrier substrate.

11. The RF filter circuit of claim 1, wherein the electromagnetic coupling comprises a magnetic coupling as a main constituent.

12. An RF filter comprising the RF filter circuit of claim 1.

13. A duplexer comprising the RF filter of claim 12, wherein the rejection frequency band is a reception band and where the enhanced attenuation of the RF filter circuit in the reception band enhances isolation of the duplexer.

14. The duplexer of claim 13, further comprising:
   a transmission filter;
   an impedance matching circuit; and
   a reception filter,
   wherein the first series resonator is an element of the transmission filter, and
   wherein the impedance matching circuit is connected between the transmission filter and the reception filter.

15. The duplexer of claim 14, wherein the reception filter comprises a double mode surface acoustic wave (DMS) structure.

* * * * *